United States Patent [19]
Spiller et al.

[11] Patent Number: 6,134,049
[45] Date of Patent: Oct. 17, 2000

[54] METHOD TO ADJUST MULTILAYER FILM STRESS INDUCED DEFORMATION OF OPTICS

[75] Inventors: Eberhard A. Spiller, Mount Kisco, N.Y.; Paul B. Mirkarimi, Sunol, Calif.; Claude Montcalm, Livermore, Calif.; Sasa Bajt, Sunol, Calif.; James A. Folta, Livermore, Calif.

[73] Assignee: The Regents of the University of California, Oakland, Calif.

[21] Appl. No.: 09/160,264

[22] Filed: Sep. 25, 1998

[51] Int. Cl.[7] .............................. G02B 5/28; G02B 1/10; F21V 9/04
[52] U.S. Cl. ...................... 359/590; 359/584; 359/586; 359/587; 359/588; 359/589; 359/359
[58] Field of Search ..................................... 359/580, 584, 359/586, 589, 350, 356, 359; 378/146, 82

[56] References Cited

U.S. PATENT DOCUMENTS 4,969,175  11/1990  Nelson et al. ............................ 378/146
5,841,584  11/1998  Takatani et al. ......................... 359/586

*Primary Examiner*—Audrey Chang
*Attorney, Agent, or Firm*—L. E. Carnahan

[57] ABSTRACT

Stress compensating systems that reduces/compensates stress in a multilayer without loss in reflectivity, while reducing total film thickness compared to the earlier buffer-layer approach. The stress free multilayer systems contain multilayer systems with two different material combinations of opposite stress, where both systems give good reflectivity at the design wavelengths. The main advantage of the multilayer system design is that stress reduction does not require the deposition of any additional layers, as in the buffer layer approach. If the optical performance of the two systems at the design wavelength differ, the system with the poorer performance is deposited first, and then the system with better performance last, thus forming the top of the multilayer system. The components for the stress reducing layer are chosen among materials that have opposite stress to that of the preferred multilayer reflecting stack and simultaneously have optical constants that allow one to get good reflectivity at the design wavelength. For a wavelength of 13.4 nm, the wavelength presently used for extreme ultraviolet (EUV) lithography, Si and Be have practically the same optical constants, but the Mo/Si multilayer has opposite stress than the Mo/Be multilayer. Multilayer systems of these materials have practically identical reflectivity curves. For example, stress free multilayers can be formed on a substrate using Mo/Be multilayers in the bottom of the stack and Mo/Si multilayers at the top of the stack, with the switch-over point selected to obtain zero stress. In this multilayer system, the switch-over point is at about the half point of the total thickness of the stack, and for the Mo/Be—Mo/Si system, there may be 25 deposition periods Mo/Be to 20 deposition periods Mo/Si.

23 Claims, 3 Drawing Sheets

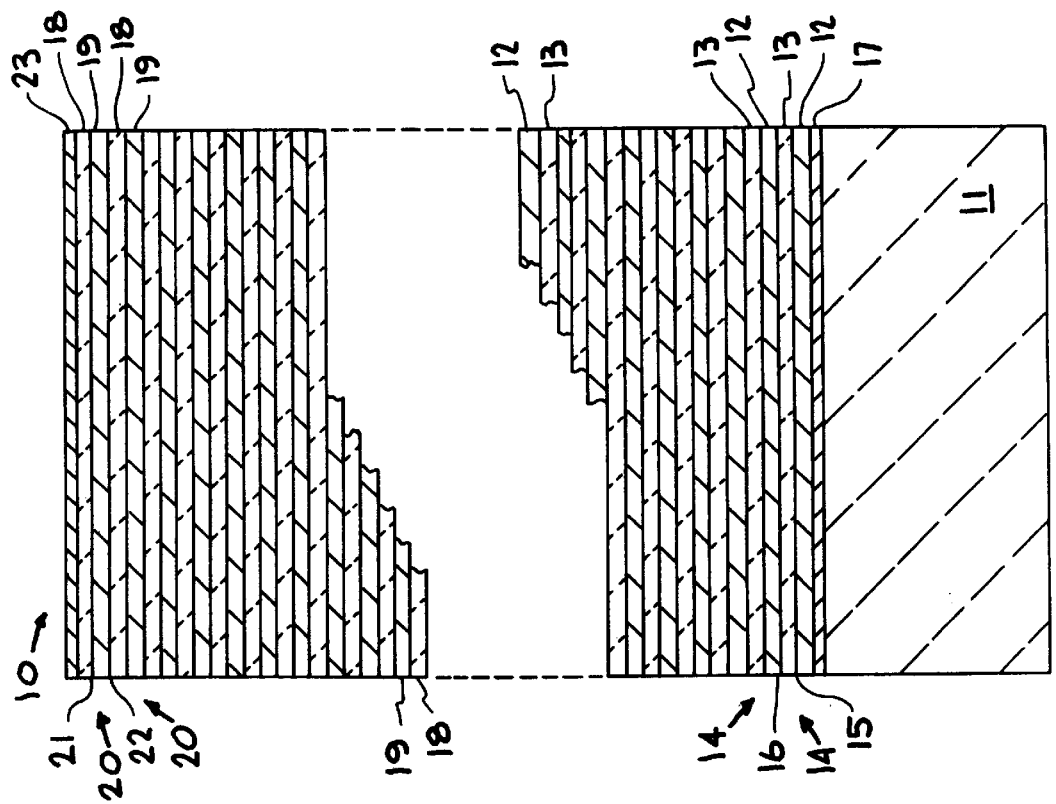
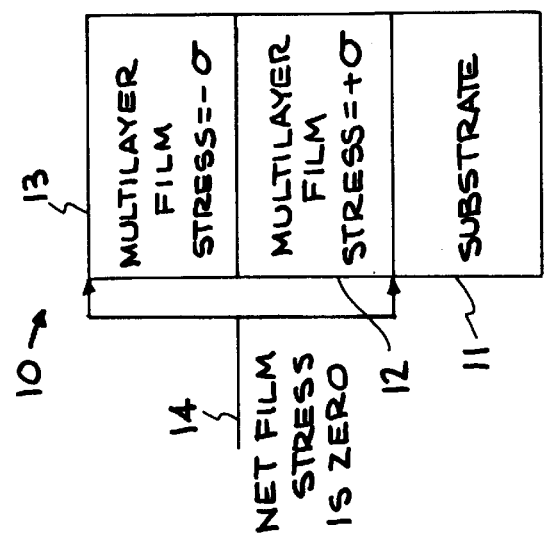
FIG. 2
FIG. 1

METHOD TO ADJUST MULTILAYER FILM STRESS INDUCED DEFORMATION OF OPTICS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to multilayer reflective films, particularly to reducing stress in substrates containing multilayer films, and more particularly to depositing a stress free multilayer system which contains two different material combinations of opposite stress, and depositing the material combination with higher reflectivity last, with a smaller total film thickness than in prior buffer layer arrangements.

Multilayer structures composed of alternating thin layers of materials with different optical properties, such as molybdenum (Mo) and silicon (Si), and molybdenum (Mo) and beryllium (Be), have proven effective as high-reflectance, near-normal incidence coatings for various applications. The Mo/Si and Mo/Be systems, for example, which have a high reflectance (about 60 percent) for certain wavelengths (10–25 nm) is of particular technological importance in high-resolution, multiple-reflection imaging systems.

Extreme-ultraviolet (EUV) lithography systems, for example, require several precisely figured, low roughness optics coated with highly reflective multilayers. To obtain sufficient throughput and image quality, these multilayer coatings should simultaneously have high reflectance (at least 65%) and low residual stress (less than 100 MPa).

An optic (substrate) will deform when a stress multilayer film is deposited upon it. A viable EUV lithography process will rely on Mo/Si or Mo/Be multilayer films to effectively reflect light in the 11–14 nm wavelength region. Mo/Si and Mo/Be films with high reflectances (greater than 60%) have large film stress (at least −400 and +330 MPa, respectively), which will deform the optic and potentially degrade the performance of an EUV lithography tool. Thus, there is a need for reducing the stress in the multilayer films without adversely effecting the reflectance of these films. Reflectance is importance since the throughput of an EUV lithography system is a function of the reflectances of each optic.

Recently a non-thermal approach to producing multilayer reflective films or coatings with high reflectance (greater than 60%) and low stress (less than 100 MPa) was developed, which utilizes a buffer layer between the multilayer film and the substrates, the buffer layer film being of opposite stress to the stress of the multilayer film. This non-thermal approach is described and claimed in copending U.S. application Ser. No. 09/027,309 filed Feb. 20, 1998 entitled "Method To Adjust Multilayer Film Stress Induced Deformation Of Optics", and assigned to the same assignee.

The present invention extends the non-thermal approach of the above-referenced application by using a stress reducing approach that simultaneously reduces/compensates stress without a significant degradation in reflectivity, and at a smaller total film thickness than for the earlier buffer-layer approach. This approach makes it possible to achieve near-zero stress, or adjust the stress, with high reflectivity and smaller total film thickness than was required in the approach of the above-referenced application. A key feature of this invention is the smaller total film thickness. The present invention provides stress free multilayer systems which contain multilayer systems with two different material combinations (e.g., Mo/Be and Mo/Si) of opposite stress, where both systems give good reflectivity at the design wavelengths. If the optical performance of the two systems (Mo/Be or Mo/Si, for example) at the design wavelength differ, the system with the poorer performance is deposited first, and the system with the better performance is deposited last, thus forming the top of the multilayer reflective film or coating. The switch-over point from one system to the other system is determined by the relative stress in each system and is at about half of the total thickness of the multilayer stack for Mo/Be—Mo/Si.

SUMMARY OF THE INVENTION

It is an object of the present invention to provide a high reflectance-low stress multilayer reflective coating, and method of fabricating same.

A further object of the invention is to adjust the stress in multilayer reflective coatings.

A further object of the invention is to reduce multilayer stress to near-zero while maintaining reflectance of at least 65%.

Another object of the invention is to provide stress compensating systems that enhance multilayer reflectivity.

Another object of the invention is to provide a substrate with, for example, Mo/Si and Mo/Be reflective multilayer coatings having a reflectance of greater than 60% and an absolute value (magnitude) of a stress of less than 100 MPa.

Another object of the invention is to reduce or negate multilayer film stress induced deformation of optics.

Another object of the invention is to provide a method whereby stress in reflective multilayer coatings can be adjusted.

Another object of the invention is to provide a substrate with a low stress reflective multilayer coating by depositing on a substrate a multilayer system having a stress, and then depositing a different multilayer system having an opposite stress on the first multilayer system.

Another object of the invention is to provide a multilayer reflective coating which utilized a stress reducing layer arrangement that simultaneously compensates (adjusts) stress without loss in the reflectivity.

Another object of the invention is to produce a multilayer reflective coating with zero stress and high reflectivity, with a total film thickness less than using a low-reflectance buffer layer between the multilayers and a substrate.

Another object of the invention is to provide a method for depositing multilayer reflective material on a substrate utilizing stress reducing multilayers, wherein the components of the stress reducing multilayers are chosen among materials that have opposite stress to that of the preferred multilayer reflecting stack and simultaneously have optical constants that allow good reflectivity at the design wavelength.

Another object of the invention is to form a multilayer reflective coating composed of a Mo/Be—Mo/Si multilayer system utilizing, for example, 25 deposition periods of Mo/Be and then 20 deposition periods of Mo/Si, resulting in a near zero stress and with a reflectivity that is substantially identical to that of a 50 deposition period Mo/Si multilayer, thus reducing the multilayer stress and thickness without a loss in reflectivity.

Other objects and advantages of the present invention will become apparent from the following description and accompanying drawings. Basically the invention involves reflective multilayer coatings which include stress compensating systems that reduces total multilayer thickness without loss in reflectivity and a method of fabrication. The stress compensating buffer systems comprises a multilayer system of a first portion of the overall multilayer and of a stress which is opposite to the stress of a multilayer system of a second portion of the overall multilayer. Aside from reducing the stress, the number of deposited layers can be reduced thereby reducing the overall multilayer thickness. In this method using, for example, Mo/Be as the first deposited multilayers and Mo/Si as the second deposited multilayers, the switch-over point from Mo/Be deposition to Mo/Si deposition is half the total thickness of the overall multilayer stack. In one Mo/Be—Mo/Si multilayer system, the reflectivity curve of a 25 periods Mo/Be-20 periods Mo/Si system is practically identical to that of a 50 periods Mo/Si system. Thus, utilizing the method of this invention, there is no need to increase the overall multilayer thickness and still reduce stress without adversely affecting the reflectivity of the overall multilayer. Thus, the present invention uses a stress reducing approach that simultaneously compensates/reduces stress and reduces total thickness without loss in reflectivity. This makes it possible to achieve zero stress and high reflectivity with smaller total film thickness.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 1 schematically illustrates the non-thermal stress compensating system in accordance with the present invention.

FIG. 2 is a partial cross-sectional view of an embodiment of an Mo/Be—Mo/Si multilayer reflective coating made in accordance with the present invention.

DETAILED DESCRIPTION OF THE INVENTION

Figure 3:
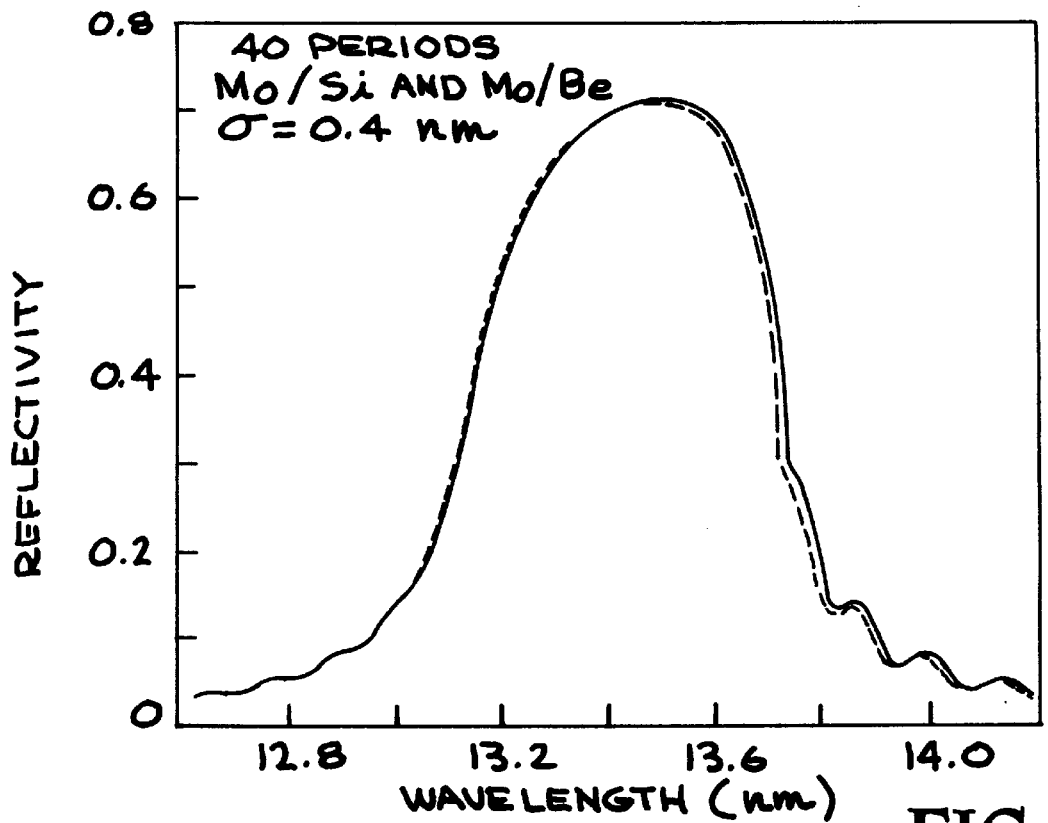
FIG. 3 graphically shows the calculated reflectivity curves for Mo/Si and Mo/Be multilayer systems.

The present invention is directed to stress compensating multilayer systems that reduces multilayer overall thickness without loss in reflectivity. The invention extends the stress reduction approach of above-referenced application Ser. No. 09/027,309 by using a stress reducing or adjust approach or stress reducing layer arrangement that simultaneously compensates stress, reduces total thickness, and maintains reflectivity of the multilayer. This present approach makes it possible to achieve zero stress and high reflectivity with smaller total film thickness than was required in the approach of the above-referenced application, in which the functions of stress reduction and reflectivity were achieved in different parts of the thin film structure by using a separate buffer layer between the substrate and the multilayer. In the present invention, the stress reducing layer system is part of the reflecting multilayer and is deposited directly on the substrate with an intermediate buffer-layer.

The main advantage of the multilayer system design of the present invention is that the stress reduction does not require the deposition of any additional layers for reducing stress, as in the buffer-layer system of the above-reference copending application. Compared to the buffer-layer approach, one needs only half the deposition time and half of the total film thickness to produce the same near-zero stress.

In the present invention, the components of the stress reducing multilayer are chosen among materials that have opposite stress to that of the preferred multilayer reflecting stack and simultaneously have optical constants that allow one to get good reflectivity at the design wavelength. For a wavelength of 13.4 nm, a wavelength presently used for EUV lithography, Si and Be have practically the same optical constants (Si:0.99988J0.00181 and Be:0.99891J0.0018), but the Mo/Si multilayer has opposite stress than the Mo/Be system. The optical constant of Mo is slightly different than that of either Si or Be, wherein Mo is 0.9265J0.00686, which gives the optical constant necessary to obtain high reflectance. Multilayer Mo/Si and Mo/Be systems can therefore be designed to have practically identical reflectivity curves.

In early experiments leading to the present invention, a Mo/Si multilayer system designed for a wavelength of 113.4 nm and deposited by magnetron sputtering on a Si wafer substrate, had a reflectivity of 64% compared to a reflectivity of 67% presently obtained for similar Mo/Si multilayers.

In verification of the present invention, a multilayer system was modeled consisting of a Mo/Be multilayer at the bottom of the stack and Mo/Si at the top of the multilayer stack, with the switch-over point (from Mo/Be to Mo/Si) selected to obtain zero stress. This switch-over point is at about one half of the total thickness of the multilayer stack for the Mo/BeMo/Si system. The reflectivity curve of a Mo/Be/Mo/Si system with 25 deposition periods of Mo/Be on the bottom 20 deposition periods of Mo/Si at the top is practically identical to that of a deposition of 50 periods of Mo/Si, but the stress of the Mo/Be-Mo/Si system was near zero compared to the normal Mo/Si stress of about –400 MPa. The overall multilayer deposition periods (thicknesses) of the stack are selected to obtain maximum reflectivity at the design wavelength and angle of incidence, and may be in the range of 5.7 to 12 nm (e.g., 6.9 nm for 13.4 nm wavelength at normal incidence), with the deposition periods of the two multilayer systems being adjusted depending on the application of the multilayer.

As described in greater detail hereinafter, the present invention provides stress free multilayer systems which contain multilayer systems with two different material combinations of opposite stress, where both systems give good reflectivity at the design wavelengths. Referring to FIG. 1, where a multilayer stack, indicated generally at 10, comprises a substrate 11 on which is first deposited a multilayer film 12 of a first material, having positive (or negative) stress, and on top of which is deposited multilayer film 13 having negative (or positive) stress, whereby the net film stress indicated at 14 is zero or near-zero. It is thus seen that by deposition of certain periods of the bottom film 12 and certain periods of the top film 13, stress from zero to any amount, either positive or negative, can be designed into the multilayer stack 10. Thus, the stress in a multilayer can be adjusted to any value from zero in either positive or negative directions.

If the optical performance of the two multilayer systems indicated at 12 and 13 in FIG. 1 are essentially the same at the design wavelength, either can be deposited as the top film 13. If the optical performance of the two multilayer systems 12 and 13 are different at the design wavelength, the system with the poorer performance is deposited first, and the system with the better performance is deposited last, thus forming the top of the system.

At a wavelength of 13.4 nm, Mo/Be and Mo/Si have nearly identical optical performance, and both could be used as the top multilayer system (film 13 in FIG. 1). Due to the toxicity of Be dust, the Mo/Si is the preferred top material for this wavelength.

FIG. 2 illustrates an embodiment of a Mo/Be—Mo/Si multilayer stack as in FIG. 1, with the Mo/Be being deposited as the bottom multilayer system or film on substrate 11 and with the Mo/Si deposited as the top multilayer system or film on the Mo/Be multilayer film. As shown, the multilayer stack 10 comprises a substrate 11 on which is deposited alternating layers 12 of Be and layers 13 of Mo. Each pair of layers 12–13 or deposit periods is indicated at 14 and has an interface 15, while each adjacent layer pairs or deposit periods 14 have an interface 16. The embodiment of FIG. 2 may have 25 deposit periods 14 of Mo/Be, as exemplified above. If needed, and depending on the composition of the substrate 11, a barrier or adhesion layer 17 may be deposited between the substrate 11 and the Be layer 12. Also, the layers 12 and 13 comprising the deposit periods 14 may be deposited in reverse order with the Mo being deposited on the substrate 11 or on a barrier or adhesion layer 17, depending on the substrate.

As seen in FIG. 2, the top of the stack 10 comprises a Mo/Si multilayer system deposited on the Mo/Be system (layers 12–13 of deposit periods 14). The Mo/Si system comprises alternating layers 18 of Si and layers 19 of Mo, with each pair of layers 18–19 defining a deposit period indicated at 20, which has an interface 21 between layers 18–19, with each adjacent layer pairs or deposit periods 20 having an interface 22. This embodiment may have 20 deposit periods 20 of Mo/Si, as exemplified above. Also, the layers 18 and 19 of deposit periods 20 may be deposited in reverse order with a topmost layer being composed of Si to match the order of the bottom stack in such a way that the reflectivity add. The stack of 10 may include a capping layer 23 deposited on the topmost deposit period 20.

By way of example, the substrate 11 may have any desired thickness as required for a specific optical design, and be composed of silicon, ultra-low thermal expansion glass or glass-ceramics (such as Zerodur or ULE), quartz, float glass, and sapphire. In the Mo/Be multilayer system, the Mo layers 19 may have a thickness of 30 to 50% of a deposit period (or a fraction α=0.30–0.50), and the Si layers 18 have a thickness of 70 to 50% of a deposit period (or a fraction α=0.70–0.50). The deposit periods for Mo/Si is 6.5–12 nm, and the deposit periods for Mo/Be is 5.7–12 nm. It is to be understood that the thickness of the deposit periods and the number of deposit periods in each of the Mo/Be and Mo/Si multilayer systems may be adjusted depending on the design wavelength and incidence angle for each application. The deposit period thickness required can be obtained by the following equation:

$$\Lambda = \frac{\text{wavelength}}{2\cos\phi\sqrt{1 - \frac{2d}{\cos^2\phi}}}$$

where d=effective index, and φ=incidence angle.

FIG. 3 shows that Mo/Si and Mo/Be multilayers can be tuned to have peak reflectance at the same wavelength. As shown the calculated reflectivity curves are for the Mo/Si and Mo/Be multilayer systems, with the Mo/Si system shown by the solid line, and the Mo/Be system shown by the dash line. The curves were calculated using 40 deposit periods of each of Mo/Si and Mo/Be, with roughness equal to 0.4 nanometer (nm), as indicated in FIG. 3. The layer thickness and boundary roughness assumed for the calculations of FIG. 3 are the same for the two systems, the only difference being in the optical constants of Si and Be, these constants have been set forth above.

Figure 4:
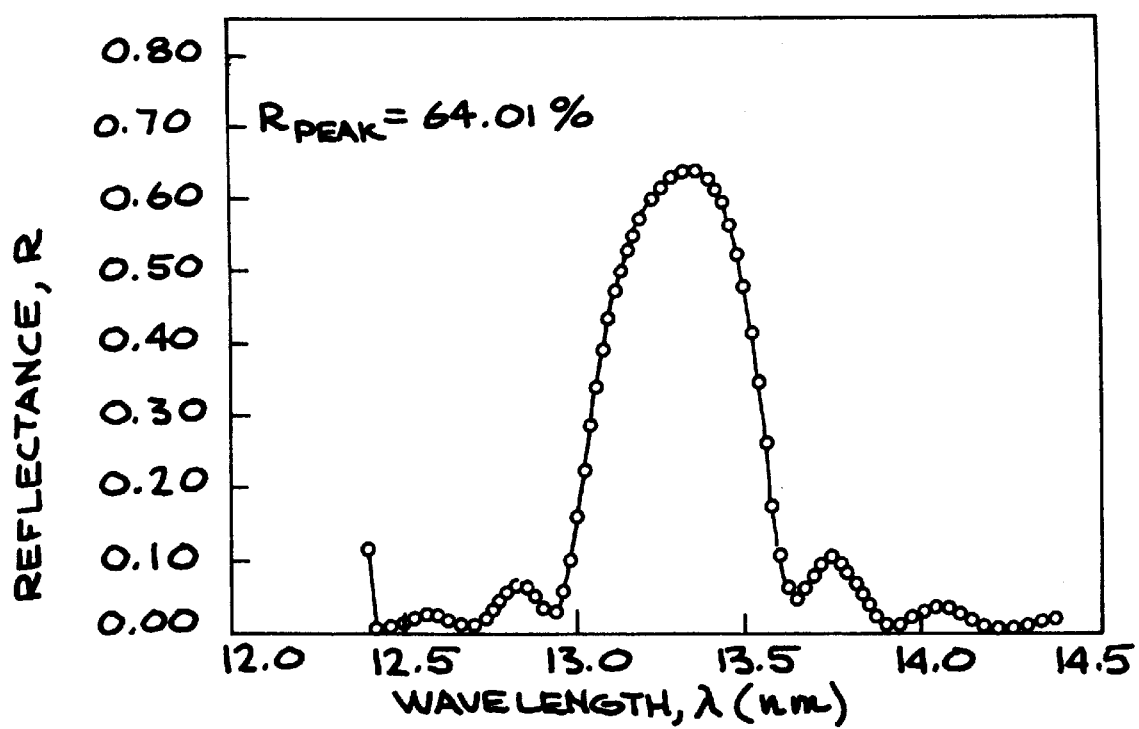
FIG. 4 shows a measured reflectivity curve of a coating of Mo/Be designed for a wavelength of 13.4 nm.

A measured reflectivity curve of a coating of Mo/Be designed for a wavelength of 13.4 nm is shown in FIG. 4. The Mo/Be curve of FIG. 4 confirms the predictions of the calculated dash line curve of FIG. 3. The deposition parameters used for the coating illustrated in FIG. 4 are those optimized for a wavelength of 11.4 nm with an increase in all deposition times by the wavelength ratio; and one can expect slightly higher reflectivity after optimization of the deposition parameters for a wavelength of 13.14 nm. As shown in FIG. 4, the curve has a reflectance peak of 64.00%, at a peak wavelength of 13.34 nm.

Figure 5:
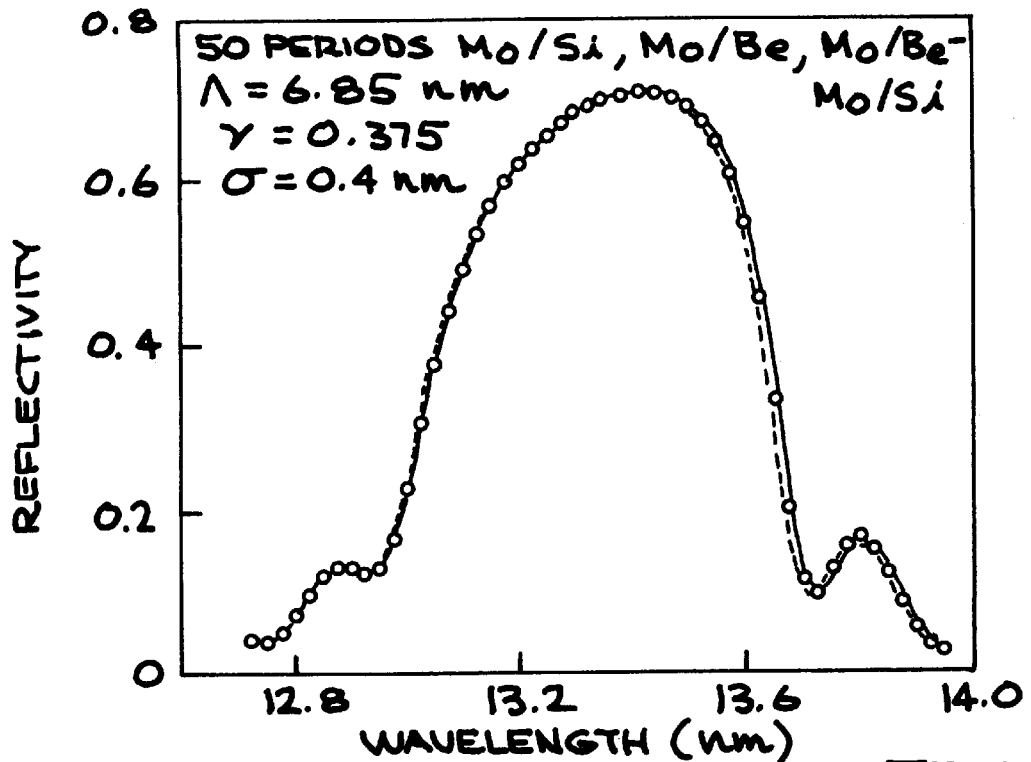
FIG. 5 shows the calculated reflectivity curve of a Mo/Be—Mo/Si multilayer system and the calculated curves for Mo/Si and for Mo/Be multilayer systems.

FIG. 5 graphically illustrates calculated reflectivity curves of a 50 deposition period multilayer system, showing Mo/Si (solid line), Mo/Be (dash line) and Mo/Be—Mo/Si (circled points), for which the bottom 25 periods of the Mo/Be—Mo/Si system curve (circles) consists of Mo/Be and the top 25 periods of that curve are Mo/Si. As seen, the three reflectivity curves are substantially identical. In this example, the Mo/Be—Mo/Si system has a period of 6.85 nm, a relative Mo fraction of 0.375, and a roughness of 0.4 nm.

The main advantage of the multilayer system design illustrated in FIG. 5 is that the stress reduction does not require the deposition of any additional layers for reducing stress, as in the buffer layer approach of the above-referenced copending application. In a magnetron system with three magnetrons (targets of Mo, Si and Be), one has only to switch from the Be target to the Si target in the middle of the run. Compared to the buffer layer approach of the above-referenced application, one needs only half the deposition time and half of the total film thickness to produce the same near-zero stress. In addition, the smaller total film thickness reduces the effects of multilayer thickness and stress non-uniformities on the optical performance of EUV lithography systems.

Figure 6:
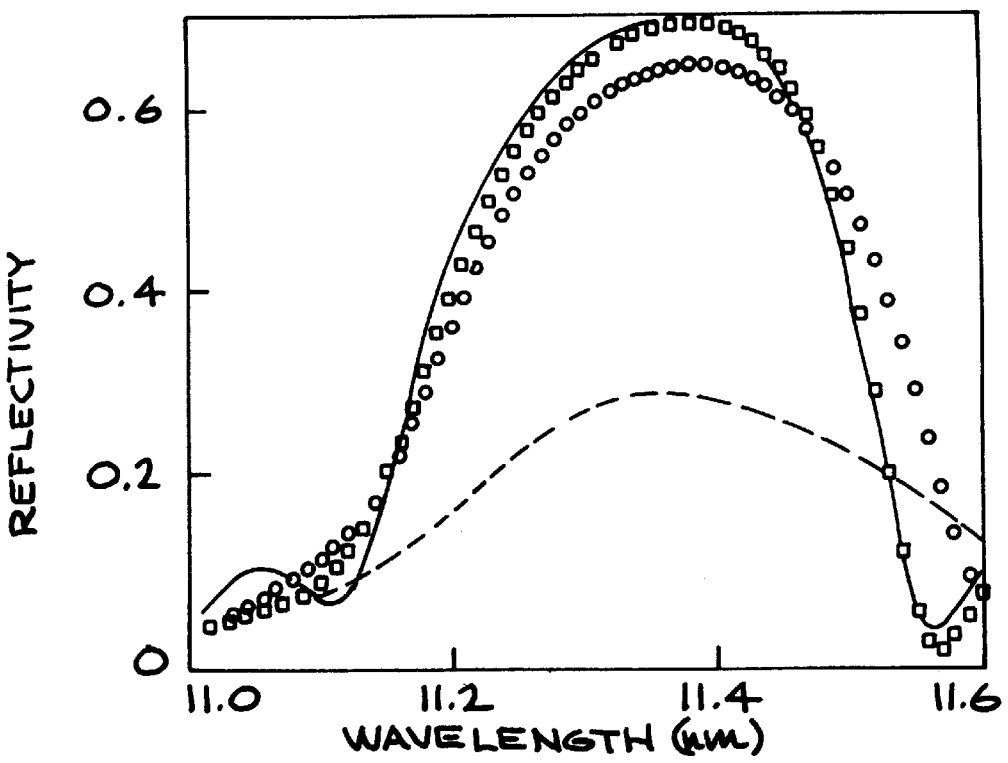
FIG. 6 shows calculated reflectivity curves for a design with zero stress and good reflectivity for a wavelength of 11.4 nm.

For a wavelength of 11.4 nm, the Mo/Be system has a considerably better performance than the Mo/Si system. The Mo/Si system has to be deposited first for this wavelength, and due to the lower reflectivity of Mo/Si at this wavelength, more layers are required for the top Mo/Be system. FIG. 6 illustrates calculated reflectivity curves for a design with zero stress and good reflectivity for the 11.4 nm wavelength. These calculated reflectivity curves for the following multilayer systems for the 11.4 nm wavelength range are: 64 periods Mo/Be (full curve), 64 periods Mo/Si (dash curve), 32 periods Mo/Be on top of 32 periods of Mo/Si (circles), and 50 periods Mo/Be on top of 50 periods of Mo/Si (squares). The optical constants for a wavelength of 11.4 nm are different than those at wavelength 13.4 nm. This example shows once again that it is possible to obtain high reflectance and near-zero stress EUV multilayer mirrors with less layer thickness than the previous buffer-layer approach, even though the optical constance of Si were not as favorable in this approach.

It has thus been shown that the present invention provides stress compensating systems that reduce multilayer total thickness without loss of reflectivity. This invention makes it possible to achieve zero stress and high reflectivity of a multilayer reflective coating with smaller total film thickness than previously known stress reduction approaches. The invention utilizes two multilayer systems of opposite stress which are deposited on either the bottom or the top of the multilayer stack, where the order of deposition depends on the optical performance of the two multilayer systems at the design wavelength. Specifically, the lower optical performance system is deposited on the bottom of the stack. By adjustment and/or optimization of the deposition periods of the two multilayer systems, any desired stress amounts can be designed into a multilayer reflective stack without increasing the overall thickness of the stack. Thus, the invention also enables a reduction in the effects of multilayer thickness and stress non-uniformity on the optical performance of imaging systems such as utilized in EUV lithography.

While particular embodiments, materials, parameters, etc. have been set forth to exemplify and describe the principles of the invention, such are not intended to be limiting. Modifications and changes may become apparent to those skilled in the art, and it is intended that the invention be limited only by the scope of the appended claims.

The invention claimed is:

1. A multilayer reflective optical element, comprising:

a substrate, a multilayer system of a first composition deposited on the substrate, and a multilayer system of a second composition deposited on the first deposited multilayer system, a switch-over point from the first composition to the second composition being at about one half of a total thickness of an overall multilayer system, each of said multilayer systems having opposite stresses, whereby overall stress on the substrate is near-zero.

2. The multilayer reflective element of claim 1, wherein said first and second compositions are composed of materials selected from the group consisting of Mo, Si and Be.

3. The multilayer reflective element of claim 2, wherein said first composition is composed of either Mo/Be or Mo/Si, and the second composition is composed of Mo/Si or Mo/Be.

4. The multilayer reflective element of claim 3, wherein the composition of said first and second compositions is dependent on design wavelengths and angle of incidence of a system using the multilayer reflective element.

5. The multilayer reflective element of claim 4, wherein the design wavelength is about 13.4 nm at normal incidence, and wherein said first and second compositions are either Mo/Be or Mo/Si.

6. The multilayer reflective element of claim 5, wherein said first composition is Mo/Be, and wherein said second composition is Mo/Si.

7. The multilayer reflective element of claim 4, wherein the design wavelength is about 11.4 nm at normal incidence, wherein the first composition is Mo/Si, and wherein the second composition is Mo/Be.

8. The multilayer reflective element of claim 1, wherein said overall multilayer system includes multilayer deposition periods thickness in the range of 5.7 to 12 nm.

9. The multilayer reflective element of claim 8, wherein said overall multilayer system includes about 25 deposition periods of Mo/Be and about 20 deposition periods of Mo/Si.

10. The multilayer reflective element of claim 8, wherein said overall multilayer system has about 50 deposition periods, with about half being Mo/Be and about half being Mo/Si.

11. The multilayer reflective element of claim 1, wherein said multilayer system has a reflectivity of at least 64%, with near-zero stress.

12. A method for fabricating a stress compensating system that reduces total multilayer thickness without loss in reflectivity, comprising:

providing a substrate, depositing on the substrate a multilayer system composed of two different multilayer material combinations having opposite stress; and switching from one of the two multilayer material combinations to another one of the two multilayer material combinations at about one half of the overall thickness of the multilayer material thickness.

13. The method of claim 12, wherein each multilayer material combinations has an optical performance at a design wavelength, and additionally including depositing the multilayer material combination having a lesser optical performance first.

14. The method claim 12, additionally including determining a design wavelength of the multilayer system, and depositing the multilayer material combination having a greater optical performance at that designed wavelength last.

15. The method of claim 12, wherein said two different multilayer material combinations are to be utilized at wavelengths of about 13.4 nm and about 11.4 nm, and depositing last the multilayer material combination having a better optical performance at each of the wavelengths.

16. The method of claim 12, additionally including forming the multilayer material combinations from materials selected from the group consisting of Mo, Si and Be.

17. The method of claim 16 wherein the multilayer system is to be used at a wavelength of about 13.4 nm, wherein said material combinations are composed of Mo/Be and Mo/Si, and wherein the Mo/Be material combination is deposited on the substrate, and the Mo/Si material combination is deposited on the Mo/Be material combination.

18. The method of claim 16, wherein the multilayer system is to be used at a wavelength of about 11.4 nm, and wherein said material combinations are composed of Mo/Si and Mo/Be, and wherein the Mo/Si material combination is deposited first.

19. The method of claim 12, additionally including depositing deposition periods of each of the two different multilayer material combinations to produce a multilayer system having a total deposition period thickness in the range of about 10–25 nm, and wherein each of said two different multilayer material combinations comprise deposition periods of about one half of the total deposition periods.

20. A multilayer reflective element comprising:

two multilayer systems, one of said two multilayer systems being composed of alternating layers of Mo and Be, another of said two multilayer systems being composed of alternating layers of Mo and Si, said two multilayer systems having opposite stress for reducing the total stress of the reflective element to near zero.

21. The multilayer reflective element of claim 20, wherein said two multilayer systems have about an equal number of alternating layers.

22. The multilayer reflective element of claim 20, wherein said two multilayer systems are switched at about one half of a total thickness of an overall multilayer thickness.

23. The multilayer reflective element of claim 20, wherein each of said two multilayer systems has an optical performance at a wavelength and wherein one of said two multilayer systems having a greater optical performance at that wavelength is located on the other of said two multilayer systems.

* * * * *